US006969853B2

(12) United States Patent
Asaki et al.

(10) Patent No.: US 6,969,853 B2
(45) Date of Patent: Nov. 29, 2005

(54) PATTERN WIDTH MEASURING APPARATUS, PATTERN WIDTH MEASURING METHOD, AND ELECTRON BEAM EXPOSURE APPARATUS

(75) Inventors: Mitsuyuki Asaki, Tokyo (JP); Akira Kintaka, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/664,440

(22) Filed: Sep. 18, 2003

(65) Prior Publication Data

US 2004/0065825 A1    Apr. 8, 2004

(30) Foreign Application Priority Data

Oct. 7, 2002    (JP)  ............................. 2002-293717

(51) Int. Cl.[7] ...................... H01J 37/00; H01J 27/244
(52) U.S. Cl. ...................................... 250/310; 250/307
(58) Field of Search ................................ 250/310, 309, 250/398, 492.2, 492.1, 307

(56) References Cited

U.S. PATENT DOCUMENTS

| | | | |
|---|---|---|---|
| 4,874,947 A * | 10/1989 | Ward et al. ................. | 250/309 |
| 5,497,034 A * | 3/1996 | Yamaguchi et al. ......... | 257/741 |
| 5,502,306 A * | 3/1996 | Meisburger et al. ........ | 250/310 |
| 5,659,172 A * | 8/1997 | Wagner et al. .............. | 250/307 |
| 5,892,224 A * | 4/1999 | Nakasuji .................... | 250/310 |
| 6,172,363 B1 * | 1/2001 | Shinada et al. ............. | 250/310 |

OTHER PUBLICATIONS

Y. Furuya, et al., "Model S-6000 Field Emission CD Measurement SEM" abstract of the 93rd Workshop of the 132nd Committee (Electron and Ion Beam Science and Technology) of Japan Society for the Promotion of Science, Nov. 8, 1985, pp. 1-5.

M. Miyoshi, et al., "Topographic Contrast in Scanning Electron Microscope During CD Measurement" abstract of the 93rd Workshop of the 132nd Committee (Electron and Ion Beam Science and Technology) of Japan Society for the Promotion of Science, Nov. 8, 1985, pp. 109-114.

* cited by examiner

*Primary Examiner*—Nikita Wells
*Assistant Examiner*—Johnnie L Smith, II
(74) *Attorney, Agent, or Firm*—Morrison & Foerster LLP

(57) ABSTRACT

A pattern width measuring apparatus for accurately measuring pattern width of a pattern formed on a wafer using an electron beam. The pattern width measuring apparatus includes: an electron gun for generating the electron beam; a deflector for scanning the pattern with the electron beam by deflecting the electron beam; a first secondary electron detector and a second secondary electron detector for detecting secondary electrons generated when the electron beam is irradiated on the pattern; a first edge detector for detecting position of a first edge of the pattern based on the quantity of the secondary electrons detected by the first secondary electron detector; a second edge detector for detecting position of a second edge of the pattern based on the quantity of the secondary electrons detected by the second secondary electron detector; and a pattern width computing section for computing pattern width of the pattern based on the position of the first edge and the position of the second edge detected by the first edge detector and the second edge detector.

11 Claims, 6 Drawing Sheets

PATTERN WIDTH MEASURING APPARATUS, PATTERN WIDTH MEASURING METHOD, AND ELECTRON BEAM EXPOSURE APPARATUS

This patent application claims priority on a Japanese patent application, 2002-293717 filed on Oct. 7, 2002, the contents of which are incorporated herein by reference.

BACKGROUND OF THE INVENTION

1. Field of the Invention

The present invention relates to a pattern width measuring apparatus, a pattern width measuring method, and an electron beam exposure apparatus. More particularly, the present invention relates to a pattern width measuring apparatus, a pattern width measuring method, and an electron beam exposure apparatus for measuring pattern width of a pattern formed on the wafer by an electron beam.

2. Description of the Related Art

With the miniaturization of semiconductor devices in recent years, it has been very important to measure pattern width when manufacturing the semiconductor devices. Therefore, there is proposed a method for measuring pattern width by scanning the pattern with an electron beam using SEM (Scanning Electron Microscope), and detecting edges of the pattern from change of the quantity of secondary electrons generated by the electron beam irradiation. (cf. Y. Furuya et al, "Model S-6000 Field Emission CD Measurement SEM", abstract of the 93rd workshop of the 132nd Committee (Electron and Ion Beam Science and Technology) of Japan Society for the Promotion of Science, Nov. 8, 1985, pp. 1–5; M. Miyoshi et al, "topographic contrast in scanning electron microscope during CD measurement", abstract of the 93rd workshop of the 132nd Committee (Electron and Ion Beam Science and Technology) of Japan Society for the Promotion of Science, Nov. 8, 1985, pp. 109–114)

However, it has been very difficult to precisely detect edges of patterns of the highly miniaturized semiconductor device of these days by the conventional measuring method of the pattern width.

SUMMARY OF THE INVENTION

Therefore, it is an object of the present invention to provide a pattern width measuring apparatus, a pattern width measuring method, and an electron beam exposure apparatus which can solve the foregoing problem. The above and other objects can be achieved by combinations described in the independent claims. The dependent claims define further advantageous and exemplary combinations of the present invention.

According to the first aspect of the present invention, there is provided a pattern width measuring apparatus for measuring pattern width of a pattern formed on a wafer using an electron beam. The pattern width measuring apparatus includes: an electron beam generating section for generating the electron beam; a deflector for scanning the pattern with the electron beam by deflecting the electron beam; a first secondary electron detector and a second secondary electron detector for detecting secondary electrons generated when the electron beam is irradiated on the wafer or the pattern; a first edge detector for detecting position of a first edge of the pattern based on the quantity of the secondary electrons detected by the first secondary electron detector out of the first secondary electron detector and the second secondary electron detector; a second edge detector for detecting position of a second edge of the pattern based on the quantity of the secondary electrons detected by the second secondary electron detector out of the first secondary electron detector and the second secondary electron detector; and a pattern width computing section for computing pattern width of the pattern based on the position of the first edge and the position of the second edge detected by the first edge detector and the second edge detector.

The first edge detector may detect the position of the first edge which is located farther than the second edge from the first edge detector, and the second edge detector may detect the position of the second edge which is located farther than the first edge from the second edge detector.

The first edge detector may detect irradiation position of the electron beam at which the quantity of the secondary electrons detected by the first secondary electron detector has a local minimum as the position of the first edge, and the second edge detector may detect irradiation position of the electron beam at which the quantity of the secondary electrons detected by the second secondary electron detector has a local minimum as the position of the second edge.

The first edge detector may detect the irradiation position of the electron beam at which the quantity of the secondary electrons detected by the first secondary electron detector has a local minimum as a bottom edge, which is a bottom end of the first edge, the second edge detector may detect the irradiation position of the electron beam at which the quantity of the secondary electrons detected by the second secondary electron detector has a local maximum as a top edge, which is a top end of the first edge, and the pattern width computing section may further compute horizontal dimension of the first edge further based on the position of the bottom edge and the position of the top edge detected by the first edge detector and the second edge detector, respectively.

The pattern width measuring apparatus may further include a third edge detector for detecting the position of the first edge and the second edge based on sum of the quantity of the secondary electrons detected by the first secondary electron detector and the quantity of the secondary electrons detected by the second secondary electron detector, and the pattern width computing section may compute the pattern width of the pattern by selecting either the position of the first edge and the position of the second edge detected by the first edge detector and the second edge detector respectively, or the position of the first edge and the position of the second edge detected by the third edge detector, based on the shape of the pattern.

The pattern width measuring apparatus may further include a third edge detector for detecting the irradiation position of the electron beam at which derivative of the sum of the quantity of the secondary electrons detected by the first secondary electron detector and the quantity of the secondary electrons detected by the second secondary electron detector has a local maximum as a top edge, which is a top end of the first edge, and the first edge detector may detect the irradiation position of the electron beam at which the quantity of the secondary electrons detected by the first secondary electron detector has a local minimum as a bottom edge, which is a bottom end of the first edge, and the pattern width computing section may further compute horizontal dimension of the first edge based on the position of the bottom edge detected by the first edge detector and the position of the top edge detected by the third edge detector.

The pattern width measuring apparatus may further include a third secondary electron detector for detecting secondary electrons generated when the electron beam is irradiated on the wafer or the pattern, and the first edge detector may select either the first secondary electron detector or the third secondary electron detector based on direction of the first edge, and detects the position of the first edge of the pattern based on the quantity of the secondary electrons detected by the selected first secondary electron detector or the selected third secondary electron detector.

The pattern width measuring apparatus may further include a third secondary electron detector and a fourth secondary electron detector for detecting the secondary electrons generated when the electron beam is irradiated on the wafer or the pattern. The first secondary electron detector and the second secondary electron detector may be oppositely disposed across an optical axis of the electron beam, the third secondary electron detector and the fourth secondary electron detector may be oppositely disposed across the optical axis of the electron beam along a direction substantially perpendicular to the direction along which the first secondary electron detector and the second secondary electron detector are disposed, and the first edge detector may detect the position of the first edge of the pattern based on the quantity of the secondary electrons detected by the third secondary electron detector instead of the first secondary electron detector and the second edge detector detects the position of the second edge of the pattern based on the quantity of the secondary electrons detected by the fourth secondary electron detector instead of the second secondary electron detector when an angle formed between a direction from the first edge to the second edge and a direction from the first secondary electron detector to the second secondary electron detector is larger than an angle formed between the direction from the first edge to the second edge and a direction from the third secondary electron detector to the fourth secondary electron detector.

The pattern width measuring apparatus may further include an objective lens for focusing the electron beam deflected by the deflector onto the wafer or the pattern, and the first secondary electron detector and the second secondary electron detector may be provided above the objective lens, and detect the secondary electrons generated when the electron beam is irradiated on the wafer or the pattern through the objective lens. The objective lens may be an electrostatic lens. The first secondary electron detector and the second secondary electron detector may be oppositely disposed across an optical axis of the electron beam.

According to the second aspect of the present invention, there is provided a pattern width measuring method for measuring pattern width of a pattern formed on a wafer using an electron beam. The pattern width measuring method includes steps of: generating the electron beam; scanning the pattern with the electron beam by deflecting the electron beam; detecting secondary electrons by the first secondary electron detector and the second secondary electron detector, the secondary electrons being generated when the electron beam is irradiated on the wafer or the pattern; detecting position of a first edge of the pattern based on the quantity of the secondary electrons detected by the first secondary electron detector out of the first secondary electron detector and the second secondary electron detector; detecting position of a second edge of the pattern based on the quantity of the secondary electrons detected by the second secondary electron detector out of the first secondary electron detector and the second secondary electron detector; and computing pattern width of the pattern based on the position of the first edge and the position of the second edge detected by the first edge detecting step and the second edge detecting step.

According to the third aspect of the present invention, there is provided an electron beam exposure apparatus for measuring pattern width of a pattern formed on a wafer using an electron beam. The electron beam exposure apparatus includes: an electron beam generating section for generating the electron beam; a deflector for scanning the pattern with the electron beam by deflecting the electron beam; a first secondary electron detector and a second secondary electron detector for detecting secondary electrons generated when the electron beam is irradiated on the wafer or the pattern; a first edge detector for detecting position of a first edge of the pattern based on the quantity of the secondary electrons detected by the first secondary electron detector out of the first secondary electron detector and the second secondary electron detector; a second edge detector for detecting position of a second edge of the pattern based on the quantity of the secondary electrons detected by the second secondary electron detector out of the first secondary electron detector and the second secondary electron detector; and a pattern width computing section for computing pattern width of the pattern based on the position of the first edge and the position of the second edge detected by the first edge detector and the second edge detector.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
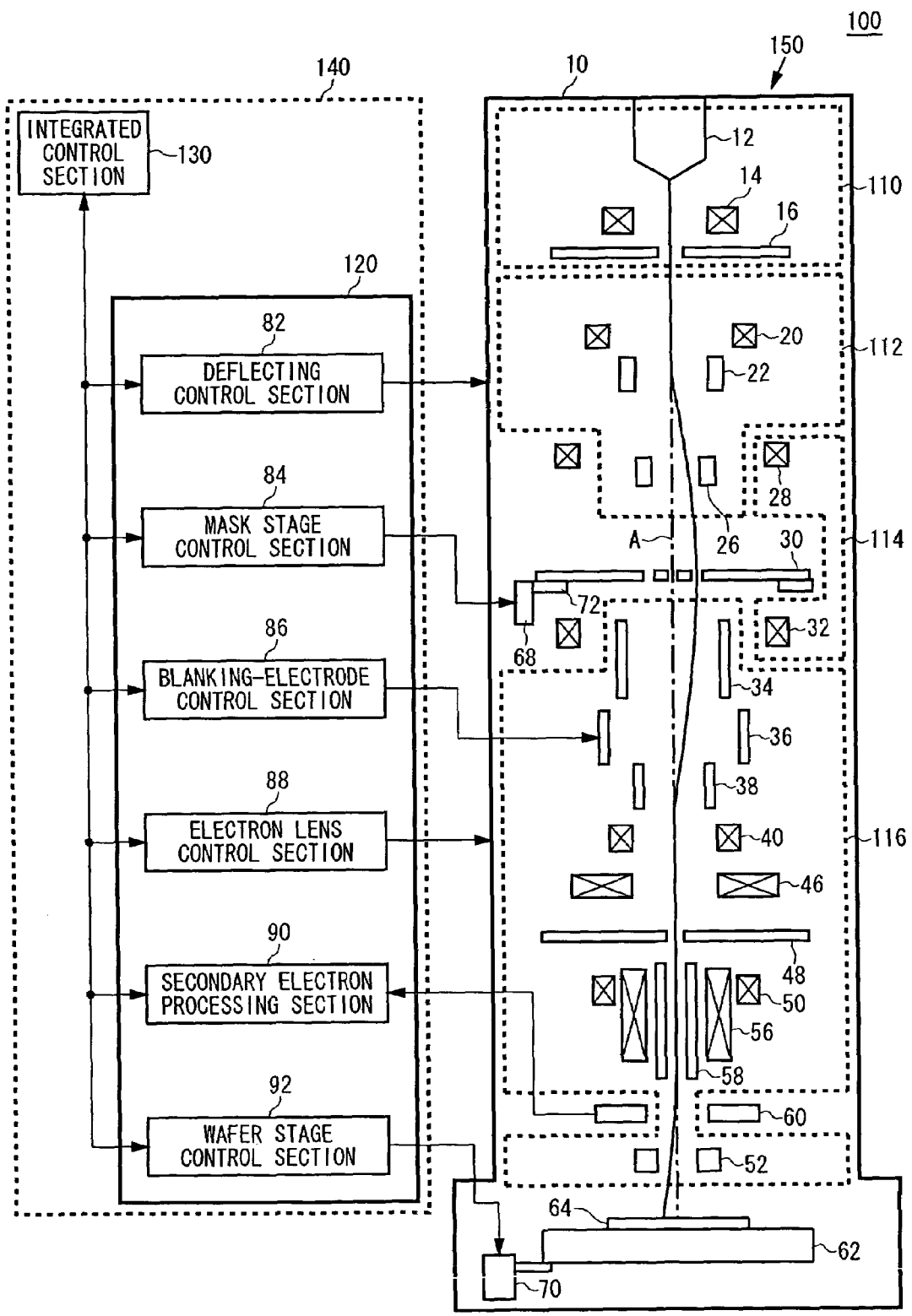
FIG. 1 is a schematic view exemplary showing a configuration of an electron beam exposure apparatus.

FIG. 1 is a block diagram of an electron beam exposure apparatus 100 according to a first embodiment of the present invention. The electron beam exposure apparatus 100 includes an exposure section 150 for performing predetermined exposure processing on a wafer 64 by an electron beam, and a control system 140 for controlling operation of each configuration of the exposure section 150.

The exposure section 150 includes an electron optics system, which includes: an electron beam discharge system 110 for discharging a predetermined electron beam into a chamber 10; a mask projection system 112 for deflecting the electron beam discharged from the electron beam discharge system 110, and for adjusting an image focus location of the electron beam around a mask 30; a focal point adjustment lens system 114 for adjusting the image focus location of the electron beam around the wafer 64; and a wafer projection system 116 for deflecting the electron beam, which has passed through the mask 30, to a predetermined area of the wafer 64 mounted on a wafer stage 62, and for adjusting a direction and a size of an image of a pattern which is to be exposed on the wafer 64.

Moreover, the exposure section 150 includes a stage system which includes: a mask stage 72 on which the mask 30 is mounted, where the mask 30 includes a plurality of blocks which are shaped into shapes which are to be exposed on the wafer 64; a mask stage drive section 68 for driving the mask stage 72; a wafer stage 62 on which the wafer 64 is mounted, where the patterns are to be exposed on the wafer; and a wafer stage drive section 70 for driving the wafer stage 62. Furthermore, the exposure section 150 includes a plurality of secondary electron detectors 60 for detecting secondary electrons and backscattered electrons scattered from the direction of the wafer 64 for adjustment of the electron optics system, converting the quantity of the electrons into a corresponding electrical signal, and outputting the converted electrical signal.

The electron beam discharge system 110 includes: an electron gun 12, which is an example of an electron beam generating section for generating an electron beam; a first electron lens 14 for determining a focal point position of the electron beam; and a first slit section 16 with an opening (slit) having a rectangle shape through which the electron beam passes. An alternate long and short dash line A in FIG. 1 indicates an optical axis of the electron beam discharged from the electron beam discharge system 110, in a case where the electron beam is not deflected by the electron optics system.

The mask projection system 112 includes: a first deflector 22 and a second deflector 26 as a deflecting system for the mask for deflecting the electron beam; and a second electron lens 20 as a focus system for the mask for adjusting a focal point of the electron beam. The first deflector 22 and the second deflector 26 deflect the electron beam to a predetermined area on the mask 30. For example, the predetermined area is a block having a pattern which is to be exposed on the wafer 64. By allowing the electron beam to pass through the pattern, a cross-sectional shape of the electron beam becomes the shape of the pattern formed in the block. The second electron lens 20 includes a function for focusing the image of the opening of the first slit section 16 onto the mask 30 mounted on the mask stage 72.

The focal point adjustment lens system 114 includes a third electron lens 28 and a fourth electron lens 32. The wafer projection system 116 includes a fifth electron lens 40, a sixth electron lens 46, a seventh electron lens 50, an objective lens 52, a third deflector 34, a fourth deflector 38, a main deflector 56, a sub deflector 58, a blanking electrode 36, and around aperture section 48.

The third electron lens 28 and the fourth electron lens 32 focus the electron beam onto the wafer 64. The fifth electron lens 40 adjusts rotation of the electron beam so that the electron beam is applied on the wafer 64 in a desired direction. The sixth electron lens 46 and the seventh electron lens 50 adjust the reduction ratio of the pattern image applied on the wafer 64 to the pattern formed on the mask 30. The third deflector 34 deflects the electron beam toward the direction of the optical axis A at a downstream of the mask 30 in the irradiation direction of the electron beam. The fourth deflector 38 deflects the electron beam to a direction substantially parallel with the optical axis A. The main deflector 56 and the sub deflector 58 deflect the electron beam so that the electron beam is applied on the predetermined area of the wafer 64. In the present embodiment, the main deflector 56 is used for deflecting the electron beam between a plurality of subfields, each of which includes a plurality of areas which can be irradiated by single shot of the electron beam (to be referred to as shot area hereinafter), and the sub deflector 58 is used for the deflection between the shot areas in the subfield.

The round aperture section 48 includes a circular opening (round aperture). The round aperture section 48 allows the electron beam irradiated in the round aperture to pass through it, and blocks the electron beam irradiated outside the round aperture. The blanking electrode 36 deflects the electron beam so that the electron beam may be irradiated outside the round aperture. Therefore, the blanking electrode 36 prevents the electron beam passing through the round aperture section 48 by deflecting the electron beam.

The control system 140 includes an integrated control section 130 and an individual control section 120. The individual control section 120 includes a deflecting control section 82, a mask stage control section 84, a blanking-electrode control section 86, an electron lens control section 88, a secondary electron processing section 90, and a wafer stage control section 92. For example, the integrated control section 130 is a work station and collectively controls each control section of the individual control section 120. The deflecting control section 82 supplies the deflection data indicating the amount of deflection to the first deflector 22, the second deflector 26, the third deflector 34, the fourth deflector 38, the main deflector 56, and the sub deflector 58, and controls the amount of the deflection correction of the first deflector 22, the second deflector 26, the third deflector 34, the fourth deflector 38, the main deflector 56, and the sub deflector 58. The mask stage control section 84 controls the mask stage drive section 68, and causes the mask stage 72 to move.

When the pattern exposed on the wafer 64 is to be changed, or when areas on the wafer 64 for exposing the pattern are to be changed, the blanking-electrode control section 86 controls the blanking electrode 36 to deflect the electron beam so that the electron beam may not pass through the round aperture section 48. This prevents the electron beam being irradiated on the wafer 64. The electron lens control section 88 controls the current or voltage supplied to the first electron lens 14, the second electron lens 20, the third electron lens 28, the fourth electron lens 32, the fifth electron lens 40 the sixth electron lens 46, the seventh electron lens 50, and the objective lens 52. The secondary electron processing section 90 outputs data in which the quantity of the secondary electrons and the backscattered electrons detected by the secondary electron detectors 60 is indicated. The wafer stage control section 92 controls the wafer stage drive section 70, and causes the wafer stage 62 to move to a predetermined position.

In addition, the electron beam exposure apparatus 100 is an example of the pattern width measuring apparatus of the present invention for measuring pattern width of the pattern formed on the wafer 64 using the electron beam. The main deflector 56 or the sub deflector 58 scans the pattern formed on the wafer 64 with the electron beam. Then, the secondary electron detector 60 detects the secondary electrons generated when the electron beam is irradiated on the wafer 64 or on the pattern. Then, the secondary electron processing section 90 outputs the data in which the quantity of the secondary electrons and the backscattered electrons detected by the secondary electron detector 60 is indicated, and supplies it to the integrated control section 130. Based on the data supplied from the secondary electron processing section 90, the integrated control section 130 detects the position of the edge of the pattern, and computes pattern width, i.e., line width of the pattern, and the width between patterns.

Alternatively, the electron beam exposure apparatus 100 is a variable rectangle exposure apparatus for exposing a pattern on the wafer 64 by a variable rectangle beam, or it is a multi-beam exposure apparatus for exposing a pattern on the wafer 64 by a plurality of electron beams.

Figure 2:
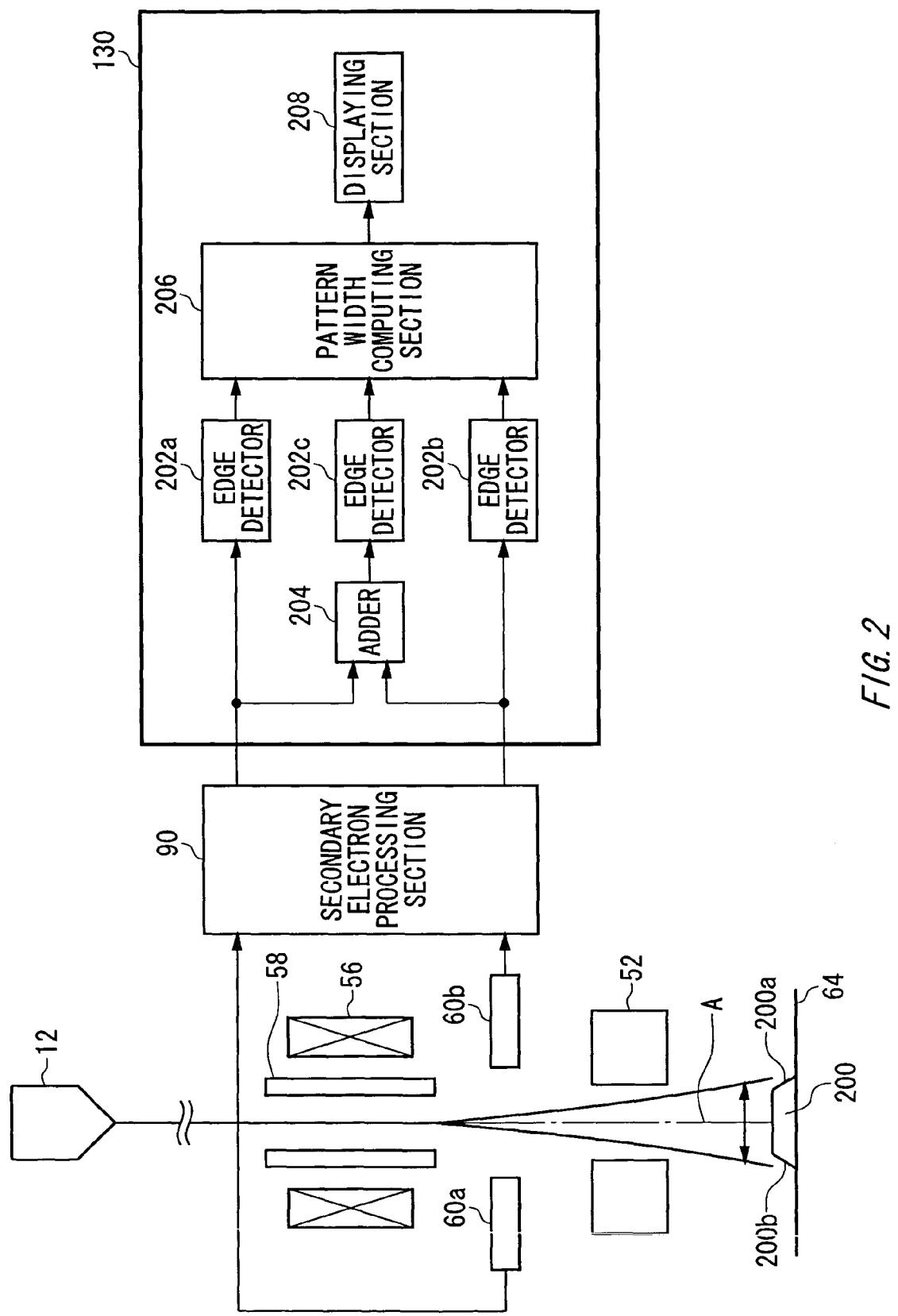
FIG. 2 is a schematic drawing exemplary showing a configuration of pattern width measuring means.

FIG. 2 is a schematic drawing exemplary showing a configuration of pattern width measuring means of the electron beam exposure apparatus 100. The pattern width measuring means includes: the electron gun 12 for generating the electron beam; the main deflector 56 and the sub deflector 58 for deflecting the electron beam to scan a pattern 200 with the electron beam; the secondary electron detector 60a and the secondary electron detector 60b for detecting the secondary electrons generated when the electron beam is irradiated on the wafer 64 or the pattern 200; the objective lens 52 for focusing and irradiating the electron beam onto the wafer 64 or the pattern 200, where the electron beam is deflected by the main deflector 56 or the sub deflector 58; the secondary electron processing section 90 for outputting the data in which the quantity of the secondary electrons detected by the secondary electron detector 60a and the secondary electron detector 60b is indicated, and the integrated control section 130 for computing the pattern width of the pattern 200 based on the data output from the secondary electron processing section 90.

The secondary electron detectors 60a and 60b are provided above the objective lens 52, i.e., between the electron gun 12 and the objective lens 52, and detect the secondary electrons through an objective lens 52, the secondary electrons being generated when the electron beam is irradiated on the wafer 64 or the pattern 200. Moreover, it is preferable that the secondary electron detectors 60a and 60b are oppositely disposed across an optical axis A of the electron beam. An electromagnetic lens may be used for the objective lens 52. However, if it is an electromagnetic lens, since the secondary electrons generated by the wafer 64 or the pattern 200 may rotate about the optical axis A by magnetism, it is difficult to determine the position at which each of the secondary electrons is generated on the wafer 64 or the pattern 200. Therefore, it is preferable that the objective lens 52 is an electrostatic lens.

Moreover, the integrated control section 130 includes: an edge detector 202a for detecting position of an edge 200a of the pattern 200 based on the quantity of the secondary electrons detected by the secondary electron detector 60a out of the secondary electron detectors 60a and 60b; an edge detector 202b for detecting position of an edge 200b of the pattern 200 based on the quantity of the secondary electrons detected by the secondary electron detector 60b out of the secondary electron detectors 60a and 60b; an adder 204 for adding the data in which the quantity of the secondary electrons detected by the secondary electron detector 60a is indicated, and the data in which the quantity of the secondary electrons detected by the secondary electron detector 60b is indicated; an edge detector 202c for detecting the position of the edges 200a and 200b of the pattern 200 based on the sum of the quantity of the secondary electrons output from the adder 204, i.e., the sum of the quantity of the secondary electrons detected by the secondary electron detector 60a and the quantity of the secondary electrons detected by the secondary electron detector 60b; a pattern width computing section 206 for computing the pattern width of the pattern 200 based on the position of the edges 200a and 200b detected by either of the edge detectors 202a, 202b, or 202c; and a displaying section 208 for displaying the data output from the secondary electron processing section 90 and/or the pattern width computed by the pattern width calculating section 206.

Alternatively, the pattern width computing section 206 computes the pattern width of the pattern by selecting either the position of the edges 200a and 202b detected by the edge detectors 202a and 202b, or the position of edges 200a and 200b detected by the edge detector 202c, based on the shape of the pattern 200. For example, the pattern width computing section 206 selects them based on the thickness of the pattern 200, or based on the angle formed between a top face and a side face (edge face) of the pattern 200. Specifically, in case that the electron beam is irradiated near the edges 200a and 200b on the wafer 64, since the quantity of the secondary electrons generated at the wafer 64 collide with the pattern 200 and consequently the quantity of the secondary electrons detected by the detectors 60a and 60b decreases, the pattern computing section 206 computes the pattern width of the pattern 200 based on the position of the edges 200a and 202b detected by the edge detectors 202a and 202b in case that the thickness of the pattern 200 is thicker than a predetermined thickness or in case that the angle formed between the top face and the side face of the pattern 200 is larger than a predetermined angle. On the other hand, in case that the thickness of the pattern 200 is not thicker than the predetermined thickness, or in case that the angle formed between the top face and the side face of the pattern 200 is not larger than a predetermined angle, since the decreasing of the secondary electrons, which are generated at the wafer 64 and detected by the secondary electron detectors 60a and 60b, caused by the collision of the electrons with the pattern 200 is not observed so much compared with the former case, the pattern width of the pattern 200 is computed based on the position of the edges 200a and 200b detected by the edge detector 202c.

By determining the position of the edges 200a and 200b of the pattern 200 detected by the edge detectors 202a, 202b, and 202c selectively based on the shape of the pattern 200, the pattern width of the pattern 200 having various shape is correctly computable.

Figure 3A:
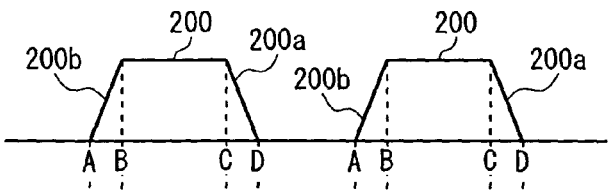
FIG. 3A is a cross sectional view of a pattern formed on a wafer.
Figure 3B:
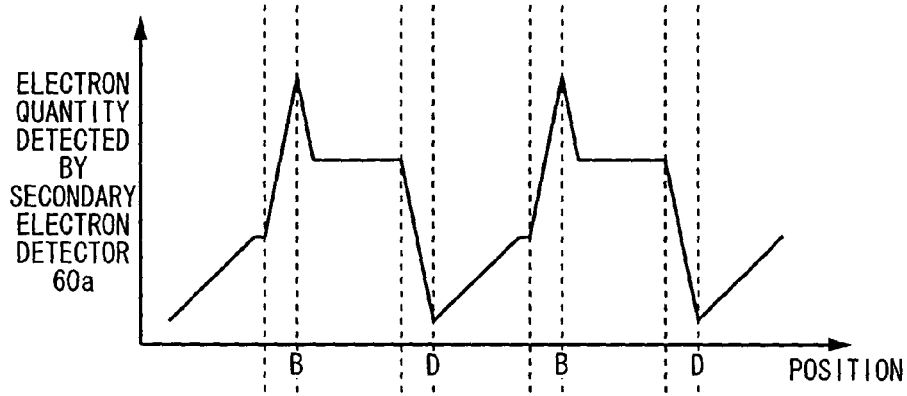
FIG. 3B is a graphic chart showing the quantity of secondary electrons detected by a secondary electron detector.
Figure 3C:
FIG. 3C is a graphic chart showing the quantity of secondary electrons detected by another secondary electron detector.
Figure 3D:
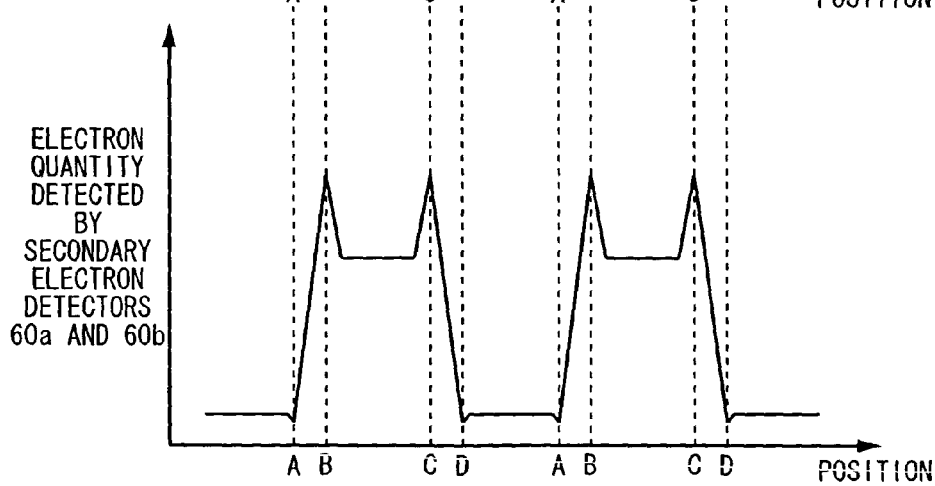
FIG. 3D is a graphic chart showing the quantity of secondary electrons detected by the two secondary electron detectors.

FIG. 3A is a cross sectional view of the pattern 200 formed on the wafer 64. FIG. 3B is a graphic chart showing the quantity of the secondary electrons detected by the secondary electron detector 60a. FIG. 3C is a graphic chart showing the quantity of the secondary electrons detected by the secondary electron detector 60b. FIG. 3D is a graphic chart showing the quantity of the secondary electrons detected by the secondary electron detectors 60a and 60b.

As shown in FIG. 3B, the quantity of the electrons detected by the secondary electron detector 60a has the local minimum at D on the horizontal axis, and it considers the irradiation position D of the electron beam as the position of the edge 200a. The edge detector 202a detects the position of the edge 200a which is located farther than the edge 200b from the secondary electron detector 60a.

As shown in FIG. 3C, the quantity of the electrons detected by the secondary electron detector 60b has the local minimum at A on the horizontal axis, and it considers the irradiation position A of the electron beam as the position of the edge 200b. The edge detector 202b detects the position of the edge 200b which is located farther than the edge 200a from the secondary electron detector 60b.

Alternatively, based on the quantity of electrons detected by the secondary electron detector 60a shown in FIG. 3B, the edge detector 202a considers the irradiation position D of the electron beam as the bottom edge, i.e., the bottom end of the edge 200a, where the quantity of the secondary electrons detected by the secondary electron detector 60a has the local minimum, and considers the irradiation position B of the electron beam as the top edge. i.e., the top end of the edge 200b, where the quantity of the secondary electrons detected by the secondary electron detector 60a has the local maximum. Moreover, based on the quantity of electrons detected by the secondary electron detector 60b shown in FIG. 3C, the edge detector 202b considers the irradiation position A of the electron beam as the bottom edge, i.e., the bottom end of the edge 200b, where the quantity of the secondary electrons detected by the secondary electron detector 60b has the local minimum, and considers the irradiation position C of the electron beam as the top edge. i.e., the top end of the edge 200a, where the quantity of the secondary electrons detected by the secondary electron detector 60b has the local maximum.

The pattern width computing section 206 computes the pattern width of the pattern 200 based on the position D of the bottom edge of the edge 200a detected by the edge detector 202a and the position A of the bottom edge of the edge 200b detected by the edge detector 202b. Moreover, the pattern width computing section 206 computes horizontal dimension of the edge 200a or 200b based on the position D of the bottom edge and the position C of top edge of the edge 200a, or the position A of the bottom edge and the position B of the top edge of the edge 200b, which are respectively detected by the edge detectors 202a and 202b. Here, the horizontal dimension is a projected length of the edge onto the wafer 64 being substantially perpendicular to the pattern 200.

Moreover, based on the quantity of electrons detected by the secondary electron detectors 60a and 60b shown in FIG. 3D, the edge detector 202c considers the irradiation positions A and D of the electron beam as the bottom edge of the edge 200b and the bottom edge of the edge 200a, where the sum of the quantity of the secondary electrons detected by secondary electron detector 60a and the quantity of the secondary electrons detected by secondary electron detector 60b has the local minimum, and considers the irradiation positions B and C of the electron beam as the top edges of edge 200b and the top edge of the edge 200a, where the sum of the quantity of the secondary electrons detected by secondary electron detector 60a and the quantity of the secondary electrons detected by secondary electron detector 60b has the local maximum. In case such as the thickness of the pattern 200 is not thicker than a predetermined thickness, or the angle formed between the top face and the side face of the pattern 200 is not larger than a predetermined angle, the pattern width calculation 206 computes the pattern width of the pattern 200 based on the position A and the position D of the bottom edges detected by the edge detector 202c. Moreover, the pattern width computing section 206 computes the horizontal dimension of the edge 200a or 200b based on the position A of the bottom edge and the position B of the top edge, or the position C of top edge and the position D of bottom edge, which are detected by the edge detector 202c.

Figure 4A:
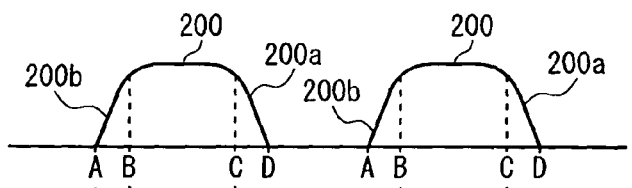
FIG. 4A is a cross sectional view of another pattern formed on the wafer.
Figure 4B:
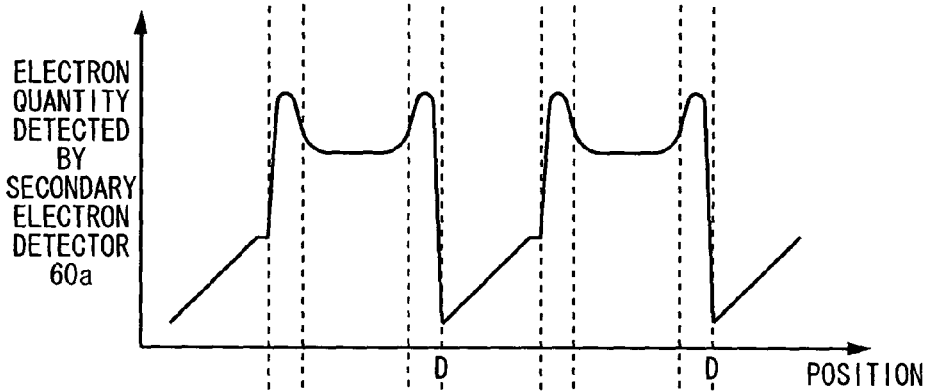
FIG. 4B is a graphic chart showing the quantity of secondary electrons detected by the secondary electron detector.
Figure 4C:
FIG. 4C is a graphic chart showing the quantity of secondary electrons detected by the other secondary electron detector.
Figure 4D:
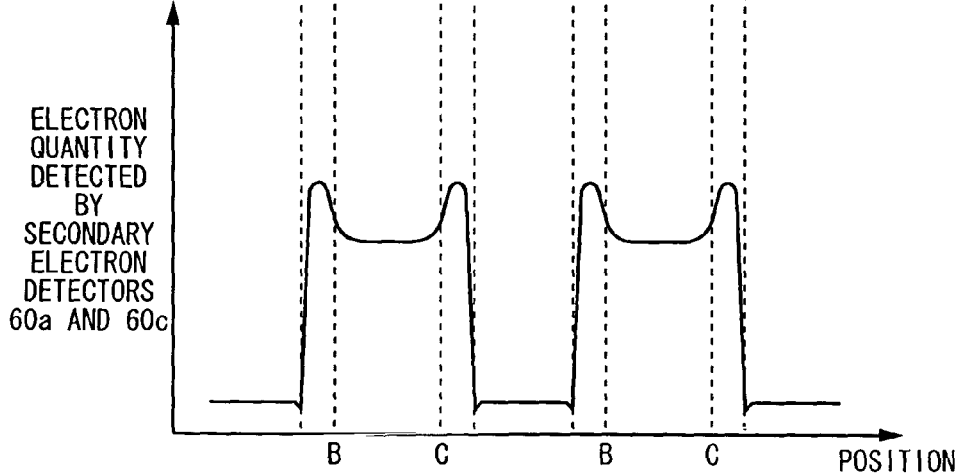
FIG. 4D is a graphic chart showing the quantity of secondary electrons detected by the two secondary electron detectors.

FIG. 4A is a cross sectional view of the pattern 200 formed on the wafer 64. FIG. 4B is a graphic chart showing the quantity of the secondary electrons detected by the secondary electron detector 60a. FIG. 4C is a graphical chart showing the quantity of the secondary electrons detected by the secondary electron detector 60b. FIG. 4D is a graphical chart showing the quantity of the secondary electrons detected by the secondary electron detectors 60a and 60b.

In case that curvature of the edges 200a and 200b of the pattern 200 is large as shown in FIG. 4A, it is difficult to determine the irradiation position of the electron beam by the local extremum of the quantity of the secondary electron detected by the secondary electron detectors 60a or 60b as shown in FIG. 3B or FIG. 3c, and consequently the edges 200a and 200b may be unable to be detected correctly. In such a case, the edges 200a and 200b will be detected and the pattern width of the pattern 20 will be computed as follows.

As shown in FIG. 4B, the quantity of the electrons detected by the secondary electron detector 60a has the local minimum at D on the horizontal axis, and it considers the irradiation position D of the electron beam as the position of the bottom edge of the edge 200a. The edge detector 202a detects the position of the edge 200a which is located farther than the edge 200b from the secondary electron detector 60a.

As shown in FIG. 4C, the quantity of the electrons detected by the secondary electron detector 60b has the local minimum at A on the horizontal axis, and it considers the irradiation position A of the electron beam as the bottom edge of the position of the edge 200b. The edge detector 202b detects the position of the edge 200b which is located farther than the edge 200a from the secondary electron detector 60b.

Moreover, based on the quantity of electrons detected by the secondary electron detectors 60a and 60b shown in FIG. 4D, the edge detector 202c considers the irradiation positions B and C of the electron beam as the top edge of the edge 200b and the top edge of the edge 200a, where the derivative of the sum of the quantity of the secondary electrons detected by secondary electron detector 60a and the quantity of the secondary electrons detected by secondary electron detector 60b has the local maximum or the local minimum.

The pattern width computing section 206 computes the pattern width of the pattern 200 based on the position D of the bottom edge of the edge 200a detected by the edge detector 202a, and the position A of the bottom edge of the edge 200b detected by the edge detector 202b. Moreover, the pattern width computing section 206 computes horizontal dimension of the edge 200a based on the position D of the bottom edge of the edge 200a detected by the edge detector 202a, and the position C of the top edge of the edge 200a detected by the edge detector 202c. Moreover, the pattern width computing section 206 computes horizontal dimension of the edge 200b based on the position A of the bottom edge of the edge 200b detected by the edge detector 202b, and the position B of the top edge of the edge 200b detected by the edge detector 202c. Here, the horizontal dimension is a projected length of the edge onto the wafer 64 being substantially perpendicular to the pattern 200.

Figure 5:
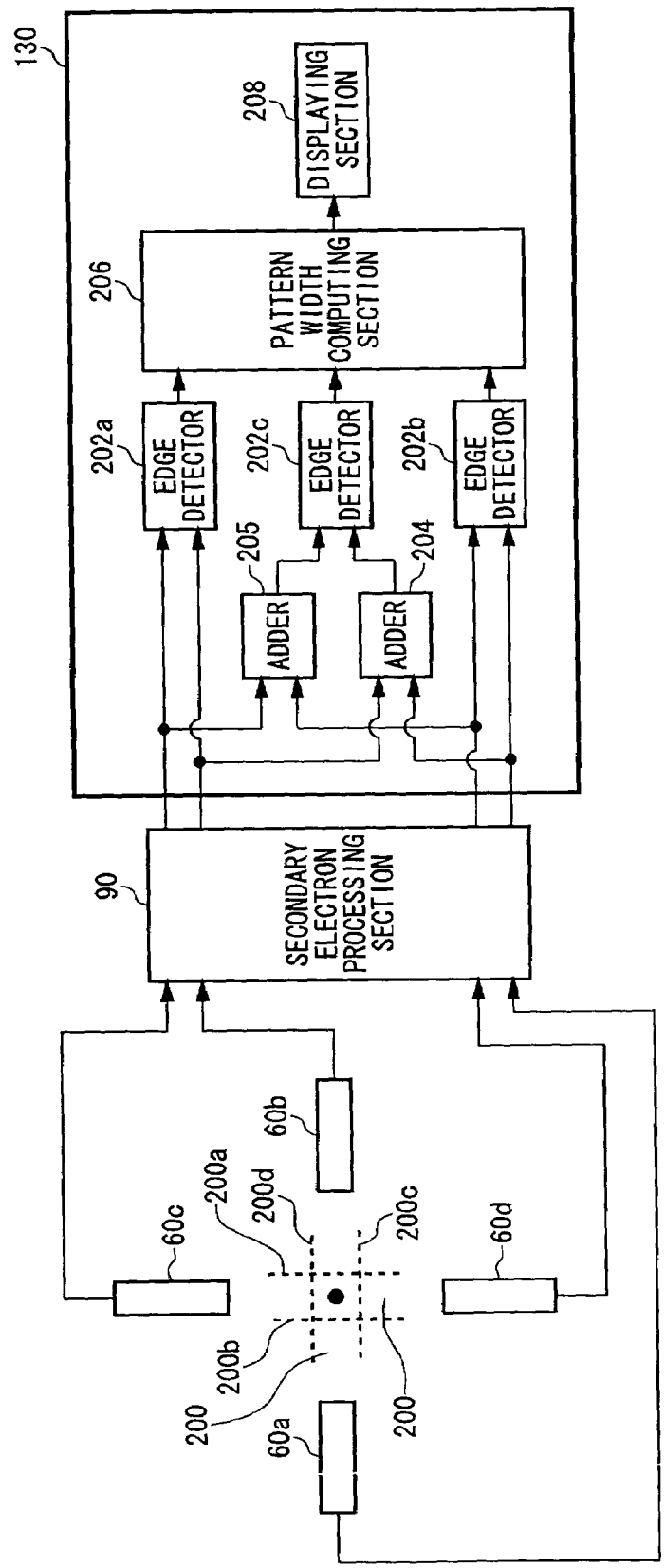
FIG. 5 is a block diagram showing another examples of a configuration of the pattern width measuring means.

FIG. 5 is a block diagram showing another example of a configuration of the pattern width measuring means of the electron beam exposure apparatus 100. Operation and configuration of each component of this example are the same as the operation and the configuration which have been explained with reference to FIGS. 1 to 4 unless otherwise explained below.

The pattern width measuring means further includes a secondary electron detector 60c and a secondary electron detector 60d for detecting the secondary electrons generated when the electron beam is irradiated on the wafer 64 or the pattern 200. The secondary electron processing section 90 outputs data in which the quantity of the secondary electrons detected by the secondary electron detector 60c and the secondary electron detector 60d are indicated, and supplies them to the integrated control section 130. Moreover, the integrated control section 130 further includes an adder 205 for adding the data in which the quantity of the secondary electrons detected by the secondary electron detector 60c is indicated, and the data in which the quantity of the secondary electrons detected by the secondary electron detector 60d is indicated.

The secondary electron detectors 60c and 60d are provided above the objective lens 52, i.e., between the electron gun 12 and the objective lens 52, and detect the secondary electrons through an objective lens 52, the secondary electrons being generated when the electron beam is irradiated on the wafer 64 or the pattern 200. Moreover, it is preferable that the secondary electron detectors 60c and 60d are oppositely disposed across an optical axis A of the electron beam and along the direction substantially perpendicular to the direction along which the secondary electron detectors 60a and 60b are disposed.

The edge detector 202a detects the position of the edge 200c of the pattern 200 based on the quantity of the secondary electrons detected by the secondary electron detector 60c out of the secondary electron detectors 60c and 60d. The edge detector 202b detects the position of the edge 200d of the pattern 200 based on the quantity of the secondary electrons detected by the secondary electron detector 60d out of the secondary electron detectors 60c and 60d. The edge detector 202c detects the position of the edges 200c and 200d of the pattern 200 based on the output of the adder 205, i.e., the sum of the quantity of the secondary electrons detected by the secondary electron detector 60c and the quantity of the secondary electrons detected by the secondary electron detector 60d.

When the angle formed between the direction from the edge 200c to the edge 200d and the direction from the secondary electron detector 60a to the secondary electron detector 60b is larger than the angle formed between the direction from the edge 200c to the edge 200d and the direction from the secondary electron detector 60c to the secondary electron detector 60d, the edge detector 202a detects the position of the edge 200c of the pattern 200 based on the quantity of the secondary electrons detected by the secondary electron detector 60c instead of the secondary electron detector 60a, and the edge detector 202b detects the position of the edge 200d of the pattern 200 based on the quantity of the secondary electrons detected by the secondary electron detector 60d instead of the secondary electron detector 60b.

In other words, the edge detectors 202a and 202b detect the position of the edges 200a and 200b of the pattern 200 formed along the direction from the secondary electron detector 60c to the secondary electron detector 60d, respectively. Moreover, the edge detectors 202c and 202d detect the position of the edges 200c and 200d of the pattern 200 formed along the direction from the secondary electron detector 60a to the secondary electron detector 60b, respectively.

That is, the pattern width calculation means includes the secondary electron detectors 60c and 60d provided in the different position from the position where the secondary electron detectors 60a and 60b are provided. The edge detector 202a selects either the secondary electron detector 60a or 60c based on the direction of the edge of the pattern 200, and detects the position of the edge 200a or 200c based on the quantity of the secondary electrons detected by the selected secondary electron detector 60a or 60c. The edge detector 202b selects either the secondary electron detector 60b or 60d based on the direction of the edge of the pattern 200, and detects the position of the edge 200b or 200d based on the quantity of the secondary electrons detected by the selected secondary electron detector 60b or 60d.

Therefore, the edge detectors 202a, 202b, and 202c detect the edges of the pattern 200 with sufficient accuracy by selecting one of the secondary electron detectors 60a, 60b, 60c, and 60d according to line direction of the pattern 200 on the wafer 64 or the longitudinal direction of the edge by. Therefore, the pattern width computing section 206 computes the pattern width of the pattern 200 with sufficient accuracy based on the position of the edge of the pattern 200 detected by the edge detector 202a, 202b or 202c.

Figure 6:
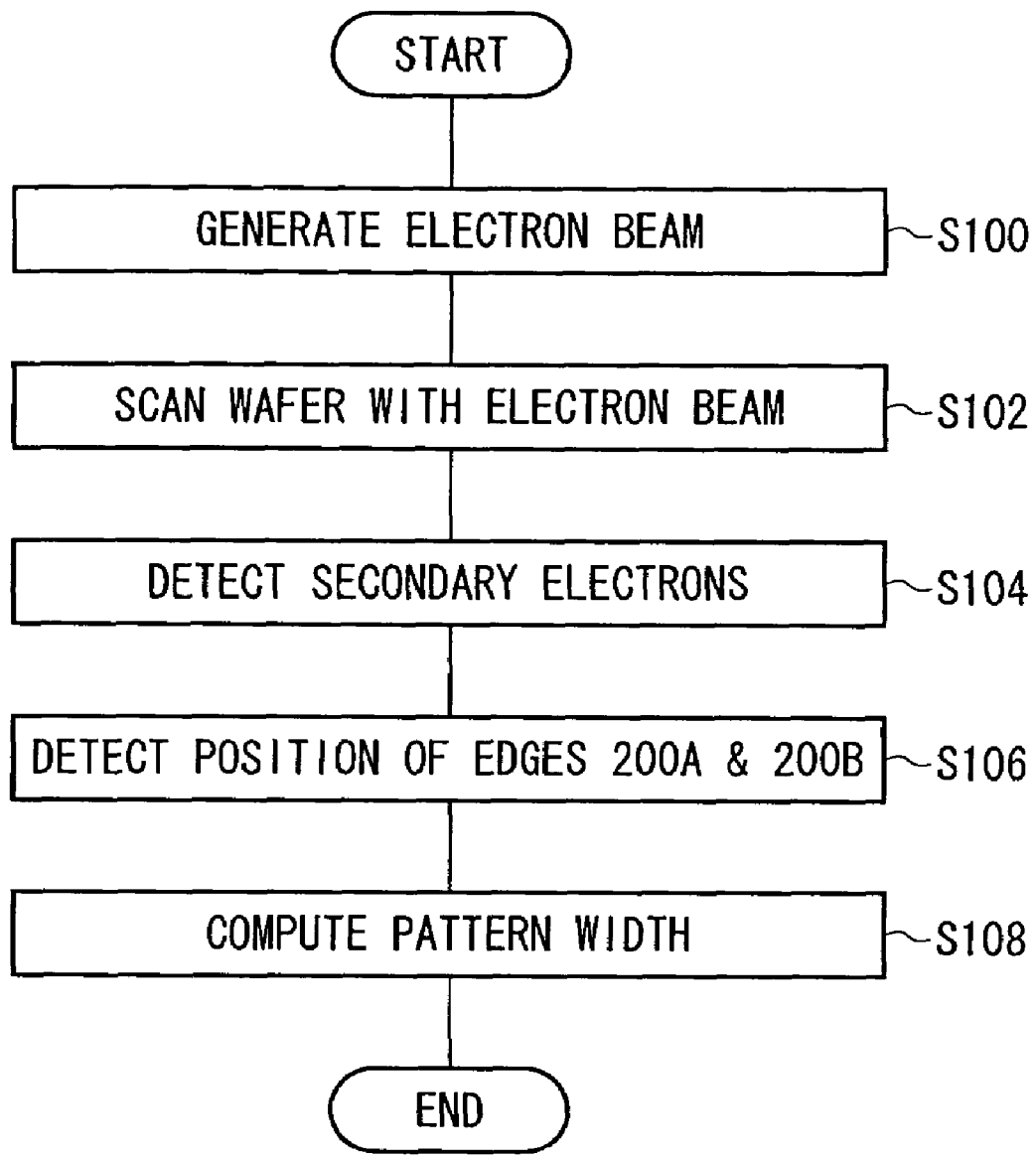
FIG. 6 is a flow chart exemplary showing a flow of a pattern width measuring method.

FIG. 6 is a flow chart exemplary showing a flow of a pattern width measuring method. First, the electron gun 12 generates the electron beam (S100), and the main deflector 56 or the sub deflector 58 scans the pattern 200 formed on the wafer 64 with the electron beam (S102). Next, the secondary electron detectors 60a and 60b detect the secondary electron generated when the electron beam is irradiated on the wafer 64 or the pattern 200 (S104). Next, the edge detector 202a detects the position of the edge 200a of the pattern 200 based on the quantity of the secondary electrons detected by the secondary electron detector 60a out of the secondary electron detectors 60a and 60b, and the edge detector 202b detects the position of the edge 200b of the pattern 200 based on the quantity of the secondary electron detected by the secondary electron detector 60b out of the secondary electron detectors 60a and 60b (S106). Next, the pattern width computing section 206 computes the pattern width of the pattern 200 based on the position of the edges 200a and 200b detected by the edge detectors 202a and 202b, respectively (S108).

Alternatively, the electron beam exposure apparatus 100 forms the pattern 200 by exposing the wafer 64 and then measures the formed pattern 200 by the above-described pattern width measuring method. Alternatively, the electron beam exposure apparatus 100 measures the pattern width of the pattern 200 by the above-described pattern width measuring method and then adjusts the electron optics system based on the measurement result, and then exposes another wafer. Since the electron beam exposure apparatus 100 measures the pattern width of the pattern 200 with high precision, it exposes the highly accurate pattern on the wafer based on the measurement result.

As described above, according to the present invention, there is provided the pattern width measuring apparatus, the pattern width measuring method, and the electron beam exposure apparatus for measuring the pattern width of the pattern formed on the wafer with sufficient accuracy using the electron beam.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A pattern width measuring apparatus for measuring pattern width of a pattern formed on a wafer using an electron beam, comprising:
    an electron beam generating section for generating the electron beam;
    a deflector for scanning the pattern with the electron beam by deflecting the electron beam;
    an electrostatic lens for focusing the electron beam deflected by the deflector onto the wafer or the pattern;
    a first secondary electron detector and a second secondary electron detector provided above said electrostatic lens for detecting secondary electrons generated when the electron beam is irradiated on the wafer or the pattern through said electrostatic lens;
    a first edge detector for detecting position of a first edge of the pattern based on the quantity of the secondary electrons detected by said first secondary electron detector out of said first secondary electron detector and said second secondary electron detector;
    a second edge detector for detecting position of a second edge of the pattern based on the quantity of the secondary electrons detected by said second secondary electron detector out of said first secondary electron detector and said second secondary electron detector; and
    a pattern width computing section for computing pattern width of the pattern based on the position of the first edge and the position of the second edge detected by said first edge detector and said second edge detector.

2. The pattern width measuring apparatus as claimed in claim 1, wherein
    said first edge detector detects the position of the first edge which is located farther than the second edge from said first edge detector, and
    said second edge detector detects the position of the second edge which is located farther than the first edge from said second edge detector.

3. The pattern width measuring apparatus as claimed in claim 1, wherein,
    said first edge detector detects irradiation position of the electron beam at which the quantity of the secondary electrons detected by said first secondary electron detector has a local minimum as the position of said first edge, and
    said second edge detector detects irradiation position of the electron beam at which the quantity of the secondary electrons detected by said second secondary electron detector has a local minimum as the position of said second edge.

4. The pattern width measuring apparatus as claimed in claim 1, wherein
    said first edge detector detects the irradiation position of the electron beam at which the quantity of the secondary electrons detected by said first secondary electron detector has a local minimum as a bottom edge, which is a bottom end of the first edge,
    said second edge detector detects the irradiation position of the electron beam at which the quantity of the secondary electrons detected by said second secondary electron detector has a local maximum as a top edge, which is a top end of the first edge, and
    said pattern width computing section further computes horizontal dimension of the first edge further based on the position of the bottom edge and the position of the top edge detected by said first edge detector and said second edge detector, respectively.

5. The pattern width measuring apparatus as claimed in claim 1, further comprising a third edge detector for detecting the position of the first edge and the second edge based on sum of the quantity of the secondary electrons detected by said first secondary electron detector and the quantity of the secondary electrons detected by said second secondary electron detector, wherein
    said pattern width computing section computes the pattern width of the pattern by selecting either the position of the first edge and the position of the second edge detected by said first edge detector and said second edge detector respectively, or the position of the first edge and the position of the second edge detected by said third edge detector, based on the shape of the pattern.

6. The pattern width measuring apparatus as claimed in claim 1, further comprising a third edge detector for detecting the irradiation position of the electron beam at which derivative of the sum of the quantity of the secondary electrons detected by said first secondary electron detector and the quantity of the secondary electrons detected by said second secondary electron detector has a local maximum as a top edge, which is a top end of the first edge, wherein
    said first edge detector detects the irradiation position of the electron beam at which the quantity of the secondary electrons detected by said first secondary electron detector has a local minimum as a bottom edge, which is a bottom end of the first edge, and
    said pattern width computing section further computes horizontal dimension of the first edge based on the position of the bottom edge detected by said first edge detector and the position of the top edge detected by said third edge detector.

7. The pattern width measuring apparatus as claimed in claim 1, further comprising a third secondary electron detector for detecting secondary electrons generated when the electron beam is irradiated on the wafer or the pattern, wherein
    said first edge detector selects either said first secondary electron detector or said third secondary electron detector based on direction of the first edge, and detects the position of the first edge of the pattern based on the quantity of the secondary electrons detected by said selected first secondary electron detector or said selected third secondary electron detector.

8. The pattern width measuring apparatus as claimed in claim 1, further comprising a third secondary electron detector and a fourth secondary electron detector for detecting the secondary electrons generated when the electron beam is irradiated on the wafer or the pattern, wherein
    said first secondary electron detector and said second secondary electron detector are oppositely disposed across an optical axis of the electron beam, said third secondary electron detector and said fourth secondary electron detector are oppositely disposed across the optical axis of the electron beam along a direction substantially perpendicular to the direction along which said first secondary electron detector and said second secondary electron detector are disposed, and said first edge detector detects the position of the first edge of the pattern based on the quantity of the secondary electrons detected by said third secondary electron detector instead of said first secondary electron detector and said second edge detector detects the position of the second edge of the pattern based on the quantity of the secondary electrons detected by said fourth secondary electron detector instead of said second secondary electron detector when an angle formed between a direction from the first edge to the second edge and a direction from said first secondary electron detector to said second secondary electron detector is larger than an angle formed between the direction from the first edge to the second edge and a direction from said third secondary electron detector to said fourth secondary electron detector.

9. The pattern width measuring apparatus as claimed in claim 1, wherein said first secondary electron detector and said second secondary electron detector are oppositely disposed across an optical axis of the electron beam.

10. A pattern width measuring method for measuring pattern width of a pattern formed on a wafer using an electron beam, comprising steps of:

generating the electron beam;

scanning the pattern with the electron beam by deflecting the electron beam;

focusing the electron beam with and electrostatic lens;

detecting secondary electrons by the first secondary electron detector and the second secondary electron detector provided above said electrostatic lens, the secondary electrons being generated when the electron beam is irradiated on the wafer or the pattern through said electrostatic lens;

detecting position of a first edge of the pattern based on the quantity of the secondary electrons detected by the first secondary electron detector out of the first secondary electron detector and the second secondary electron detector;

detecting position of a second edge of the pattern based on the quantity of the secondary electrons detected by the second secondary electron detector out of the first secondary electron detector and the second secondary electron detector; and computing pattern width of the pattern based on the position of the first edge and the position of the second edge detected by said first edge detecting step and said second edge detecting step.

11. An electron beam exposure apparatus for measuring pattern width of a pattern formed on a wafer using an electron beam, comprising:

an electron beam generating section for generating the electron beam;

a deflector for scanning the pattern with the electron beam by deflecting the electron beam;

an electrostatic lens for focusing the electron beam deflected by the deflector onto the wafer or the pattern;

a first secondary electron detector and a second secondary electron detector provided above said electrostatic lens for detecting secondary electrons generated when the electron beam is irradiated on the wafer or the pattern through said electrostatic lens;

a first edge detector for detecting position of a first edge of the pattern based on the quantity of the secondary electrons detected by said first secondary electron detector out of said first secondary electron detector and said second secondary electron detector;

a second edge detector for detecting position of a second edge of the pattern based on the quantity of the secondary electrons detected by said second secondary electron detector out of said first secondary electron detector and said second secondary electron detector, the second edge detector determining a position of a second local minimum of the quantity of the detected secondary electrons; and a pattern width computing section for computing pattern width of the pattern based on the position of the first edge and the position of the second edge detected by said first edge detector and said second edge detector.

* * * * *